(12) United States Patent
Singh et al.

(10) Patent No.: US 12,521,756 B2
(45) Date of Patent: Jan. 13, 2026

(54) PROTECTIVE COATING

(71) Applicant: HZO, Inc., Morrisville, NC (US)

(72) Inventors: Shailendra Vikram Singh, London (GB); Gianfranco Aresta, London (GB); Andrew Simon Hall Brooks, London (GB); Siobhan Marie Woollard, London (GB); Gareth Hennighan, London (GB)

(*) Notice: Subject to any disclaimer, the term of this patent is extended or adjusted under 35 U.S.C. 154(b) by 0 days.

(21) Appl. No.: 18/487,203

(22) Filed: Oct. 16, 2023

(65) Prior Publication Data

US 2024/0050982 A1    Feb. 15, 2024

Related U.S. Application Data

(63) Continuation of application No. 16/466,743, filed as application No. PCT/GB2017/053720 on Dec. 12, 2017, now Pat. No. 11,786,930.

(30) Foreign Application Priority Data

Dec. 13, 2016  (GB) ...................... 1621177

(51) Int. Cl.
   - *B05D 1/00* (2006.01)
   - *B05D 7/00* (2006.01)
   (Continued)

(52) U.S. Cl.
   CPC ................. *B05D 1/62* (2013.01); *B05D 7/50* (2013.01); *C09D 127/20* (2013.01);
   (Continued)

(58) Field of Classification Search
   CPC .......... B05D 1/62; B05D 7/50; B05D 3/0486; B05D 2252/04; B05D 2451/00;
   (Continued)

(56) References Cited

U.S. PATENT DOCUMENTS

| 3,649,475 A | 3/1972 | Degnan et al. |
| 3,737,339 A | 6/1973 | Alsberg et al. |

(Continued)

FOREIGN PATENT DOCUMENTS

| CN | 1543514 | 11/2004 |
| CN | 101302636 A | 11/2008 |

(Continued)

OTHER PUBLICATIONS

Barni et al. "Characterization of the Chemical Kinetics in an O2/HMDSO RF Plasma for Material Processing" Advances in Physical Chemistry Nov. 2012 (Year: 2012).*

(Continued)

*Primary Examiner* — Robert S Walters, Jr.
(74) *Attorney, Agent, or Firm* — Intellectual Strategies

(57) ABSTRACT

A method for depositing a protective coating onto a substrate, wherein the protective coating comprises (i) a moisture-barrier layer which is in contact with the substrate and which comprises a first sub-layer, optionally one or more intermediate sub-layers, and a final sub-layer, (ii) a mechanical-protective layer which is inorganic, and (iii) a gradient layer interposing the moisture-barrier layer and the mechanical-protective layer.

6 Claims, 4 Drawing Sheets

(51) Int. Cl.
*C09D 127/20* (2006.01)
*C09D 183/04* (2006.01)
*H05K 3/28* (2006.01)
*B05D 3/04* (2006.01)

(52) U.S. Cl.
CPC ............ *C09D 183/04* (2013.01); *H05K 3/285* (2013.01); *B05D 3/0486* (2013.01); *B05D 2252/04* (2013.01); *B05D 2451/00* (2013.01); *B05D 2518/10* (2013.01); *H05K 2201/0179* (2013.01); *H05K 2201/09872* (2013.01); *H05K 2203/095* (2013.01); *H05K 2203/1322* (2013.01); *H05K 2203/1338* (2013.01)

(58) Field of Classification Search
CPC .............. B05D 2518/10; C09D 127/20; C09D 183/04; H05K 3/285; H05K 2201/0179; H05K 2201/09872; H05K 2203/095; H05K 2203/1322; H05K 2203/1338
See application file for complete search history.

(56) References Cited

U.S. PATENT DOCUMENTS

| | | |
|---|---|---|
| 3,745,536 A | 7/1973 | Klehm |
| 3,770,571 A | 11/1973 | Alsberg et al. |
| 3,931,454 A | 1/1976 | Sprengling |
| 4,136,225 A | 1/1979 | Feit et al. |
| 4,268,568 A | 5/1981 | Sard et al. |
| 4,311,749 A | 1/1982 | Hiraiwa et al. |
| 4,369,287 A | 1/1983 | Hutchinson et al. |
| 4,508,756 A | 4/1985 | Senda et al. |
| 4,547,424 A | 10/1985 | Suzuki |
| 4,562,091 A | 12/1985 | Sachdev et al. |
| 4,591,659 A | 5/1986 | Leibowitz |
| 4,640,866 A | 2/1987 | Suzuki |
| 4,681,774 A | 7/1987 | Halliwell et al. |
| 4,689,110 A | 8/1987 | Leibowitz |
| 4,710,429 A | 12/1987 | Bogan et al. |
| 4,755,911 A | 7/1988 | Suzuki |
| 4,772,509 A | 9/1988 | Komada et al. |
| 4,784,901 A | 11/1988 | Hatakeyama et al. |
| 4,784,917 A | 11/1988 | Tawara et al. |
| 4,800,243 A | 1/1989 | Osawa et al. |
| 4,895,756 A | 1/1990 | Suzuki |
| 4,911,771 A | 3/1990 | Tanaka et al. |
| 4,975,319 A | 12/1990 | Walles et al. |
| 5,043,221 A | 8/1991 | Koleske |
| 5,141,702 A | 8/1992 | Guenin et al. |
| 5,274,913 A | 1/1994 | Grebe et al. |
| 5,294,519 A | 3/1994 | Mori et al. |
| 5,352,762 A | 10/1994 | Nagai et al. |
| 5,639,555 A | 6/1997 | Bishop |
| 5,639,989 A | 6/1997 | Higgins |
| 5,734,008 A | 3/1998 | Shirasaki et al. |
| 5,858,074 A | 1/1999 | Cole et al. |
| 5,895,228 A | 4/1999 | Biebuyck et al. |
| 5,955,179 A | 9/1999 | Kickelhain et al. |
| 5,970,383 A | 10/1999 | Lee |
| 6,054,188 A | 4/2000 | Tropsha et al. |
| 6,183,883 B1 | 2/2001 | Mori et al. |
| 6,238,774 B1 | 5/2001 | Park et al. |
| 6,284,308 B2 | 9/2001 | Seki et al. |
| 6,335,224 B1 | 1/2002 | Peterson et al. |
| 6,365,841 B1 | 4/2002 | Takigami |
| 6,540,866 B1 | 4/2003 | Zhang et al. |
| 6,589,639 B2 | 7/2003 | Farquhar et al. |
| 6,650,013 B2 | 11/2003 | Yin et al. |
| 6,709,715 B1 | 3/2004 | Lang et al. |
| 6,740,816 B2 | 5/2004 | Treutlein et al. |
| 6,785,389 B1 | 8/2004 | Sella et al. |
| 6,803,092 B2 | 10/2004 | Pocius et al. |
| 6,852,931 B2 | 2/2005 | Hedler et al. |
| 6,861,092 B2 | 3/2005 | Mccarthy et al. |
| 6,924,008 B2 | 8/2005 | Takai et al. |
| 6,941,978 B2 | 9/2005 | Riffle |
| 7,045,198 B2 | 5/2006 | Nakagiri et al. |
| 7,112,265 B1 | 9/2006 | Mcaleer et al. |
| 7,176,402 B2 | 2/2007 | Okumura et al. |
| 7,195,857 B2 | 3/2007 | Tamura et al. |
| 7,327,040 B2 | 2/2008 | Aoki et al. |
| 7,340,826 B2 | 3/2008 | Hedler et al. |
| 7,396,591 B2 | 7/2008 | Miyashita et al. |
| 7,396,596 B2 | 7/2008 | Wessling |
| 7,465,478 B2 | 12/2008 | Collins et al. |
| 7,527,915 B2 | 5/2009 | Mutoh |
| 7,579,134 B2 | 8/2009 | Dueber et al. |
| 7,635,016 B2 | 12/2009 | Suzuki et al. |
| 7,651,959 B2 | 1/2010 | Fukazawa et al. |
| 7,673,970 B2 | 3/2010 | Bertelsen et al. |
| 7,891,091 B2 | 2/2011 | Li et al. |
| 7,923,059 B2 | 4/2011 | Bchir et al. |
| 7,985,677 B2 | 7/2011 | Fujii et al. |
| 8,004,860 B2 | 8/2011 | Salzman |
| 8,008,588 B2 | 8/2011 | Kaida et al. |
| 8,618,420 B2 | 12/2013 | Humphries et al. |
| 8,995,146 B2 | 3/2015 | Brooks et al. |
| 11,786,930 B2 * | 10/2023 | Singh .................... C23C 16/505 427/569 |
| 2002/0113239 A1 | 8/2002 | Uochi et al. |
| 2002/0134588 A1 | 9/2002 | Dollarhite |
| 2002/0168592 A1 | 11/2002 | Vezenov et al. |
| 2004/0026775 A1 | 2/2004 | Hecht et al. |
| 2004/0186189 A1 | 9/2004 | Muller et al. |
| 2004/0229051 A1 | 11/2004 | Schaepkens et al. |
| 2005/0121226 A1 | 6/2005 | Mckee et al. |
| 2005/0150685 A1 | 7/2005 | Hedler et al. |
| 2006/0001700 A1 | 1/2006 | Bertelsen et al. |
| 2006/0264020 A1 | 11/2006 | Lazovsky et al. |
| 2007/0108161 A1 | 5/2007 | Murugesh et al. |
| 2007/0258722 A1 | 11/2007 | Yu |
| 2008/0095954 A1 | 4/2008 | Gabelnick et al. |
| 2008/0102206 A1 | 5/2008 | Wagner |
| 2008/0176096 A1 | 7/2008 | Cheng |
| 2009/0291275 A1 | 11/2009 | Tong et al. |
| 2010/0025091 A1 | 2/2010 | Ferdinandi et al. |
| 2010/0305291 A1 | 12/2010 | Timmons et al. |
| 2011/0186334 A1 | 8/2011 | Humphries et al. |
| 2011/0253429 A1 | 10/2011 | Humphries et al. |
| 2012/0051007 A1 | 3/2012 | Alvarez et al. |
| 2012/0068162 A1 | 3/2012 | Mandlik et al. |
| 2012/0257364 A1 | 10/2012 | Hall et al. |
| 2013/0040102 A1 | 2/2013 | Gleason et al. |
| 2013/0240256 A1 | 9/2013 | Von Werne |
| 2013/0244079 A1 | 9/2013 | Prashant et al. |
| 2013/0287969 A1 | 10/2013 | Guenther et al. |
| 2013/0334292 A1 | 12/2013 | Ferdinandi et al. |
| 2013/0334511 A1 | 12/2013 | Savas et al. |
| 2014/0024180 A1 | 1/2014 | Choi et al. |
| 2014/0166998 A1 | 6/2014 | Lee et al. |
| 2014/0186774 A1 | 7/2014 | Glodde et al. |
| 2014/0251859 A1 | 9/2014 | Welkart et al. |
| 2014/0255288 A1 | 9/2014 | Arita et al. |
| 2015/0103504 A1 | 4/2015 | Yokley et al. |
| 2015/0314588 A1 | 11/2015 | Chousa et al. |

FOREIGN PATENT DOCUMENTS

| | | |
|---|---|---|
| CN | 103348502 | 10/2013 |
| CN | 103872070 | 6/2014 |
| DE | 4239324 A1 | 5/1993 |
| DE | 4437573 A1 | 6/1995 |
| DE | 102007062787 A1 | 7/2008 |
| EP | 0176736 A1 | 9/1986 |
| EP | 0176736 B1 | 9/1986 |
| EP | 0298204 A2 | 1/1989 |
| EP | 0355955 A2 | 2/1990 |
| EP | 0393832 A1 | 10/1990 |
| EP | 0449292 A2 | 10/1991 |
| EP | 0498258 B1 | 8/1992 |
| EP | 0710690 A2 | 5/1996 |
| EP | 1091201 A2 | 4/2001 |
| EP | 1331286 A2 | 7/2003 |
| EP | 2251455 A2 * | 11/2010 ........... C23C 16/045 |

(56) References Cited

FOREIGN PATENT DOCUMENTS

| | | |
|---|---|---|
| GB | 1287519 A | 8/1972 |
| GB | 1399252 A | 7/1975 |
| GB | 1484538 A | 9/1977 |
| GB | 2285340 A | 7/1997 |
| GB | 2453083 A | 3/2009 |
| GB | 2462824 A | 2/2010 |
| GB | 2500138 A | 9/2013 |
| GB | 2539231 A | 12/2016 |
| JP | S5168441 A | 6/1976 |
| JP | S60239840 A | 11/1985 |
| JP | S60257592 A | 12/1985 |
| JP | S60258232 A | 12/1985 |
| JP | H01131270 A | 5/1989 |
| JP | H0286675 A | 3/1990 |
| JP | H02120351 A | 5/1990 |
| JP | H02167329 A | 6/1990 |
| JP | H02285648 A | 11/1990 |
| JP | H03129796 A | 6/1991 |
| JP | H03242992 A | 10/1991 |
| JP | H03278494 A | 12/1991 |
| JP | H04209597 A | 7/1992 |
| JP | H06232098 A | 8/1994 |
| JP | H07173251 A | 7/1995 |
| JP | H07201502 A | 8/1995 |
| JP | H07323501 A | 12/1995 |
| JP | H0827453 A | 1/1996 |
| JP | H08143846 A | 6/1996 |
| JP | H08288331 A | 11/1996 |
| JP | H09251996 A | 9/1997 |
| JP | H11251356 A | 9/1999 |
| JP | H11305430 A | 11/1999 |
| JP | H11319635 A | 11/1999 |
| JP | 2000211057 A | 8/2000 |
| JP | 2002329741 A | 11/2002 |
| JP | 2003201571 A | 7/2003 |
| JP | 2003342311 A | 12/2003 |
| JP | 2004184340 A | 7/2004 |
| JP | 2005112981 A | 4/2005 |
| JP | 2005161778 A | 6/2005 |
| JP | 2005169538 A | 6/2005 |
| JP | 2006022400 A | 1/2006 |
| JP | 2006063315 A | 3/2006 |
| JP | 2007010794 A | 1/2007 |
| JP | 2007084764 A | 4/2007 |
| JP | 2007123370 A | 5/2007 |
| JP | 2007123712 A | 5/2007 |
| JP | 2007129039 A | 5/2007 |
| JP | 2007326956 A | 12/2007 |
| JP | 2008294391 A | 12/2008 |
| JP | 2011005837 A | 1/2011 |
| KR | 645641 B1 | 11/2006 |
| RU | 2467046 C2 | 11/2022 |
| WO | 87/07980 A1 | 12/1987 |
| WO | 89/01957 A1 | 3/1989 |
| WO | 97/11134 A1 | 3/1997 |
| WO | 97/39610 A1 | 10/1997 |
| WO | 98/58117 A1 | 12/1998 |
| WO | 00/20130 A1 | 4/2000 |
| WO | 02/095497 A1 | 11/2002 |
| WO | 03/002675 A1 | 1/2003 |
| WO | 03/016589 A1 | 2/2003 |
| WO | 03/087224 A1 | 10/2003 |
| WO | 2004/027115 A1 | 4/2004 |
| WO | 2005/121101 A1 | 12/2005 |
| WO | 2006/039019 A1 | 4/2006 |
| WO | 2008/078346 A1 | 7/2008 |
| WO | 2008/102113 A2 | 8/2008 |
| WO | 2009/026284 A2 | 2/2009 |
| WO | 2009/058732 A1 | 5/2009 |
| WO | 2010/020753 A2 | 2/2010 |
| WO | 2010/065301 A2 | 6/2010 |
| WO | 2011/104500 A1 | 9/2011 |
| WO | 2013/025480 A1 | 2/2013 |
| WO | 2013/132250 A1 | 9/2013 |
| WO | 2014/065207 A1 | 5/2014 |
| WO | 2014/155099 A1 | 10/2014 |
| WO | 2016/198870 A1 | 12/2016 |
| WO | 2017/029477 A1 | 2/2017 |

OTHER PUBLICATIONS

Coclite et al. "Single-Chamber Deposition of Multilayer Barriers by Plasma Enhanced and Initiated Chemical Vapor Deposition of Organosilicones" Plasma Process. Polym. 2010, 7, 561-570. (Year: 2010).*

Coclite et al. "Multilayer Barrier Coatings for Organic Photovoltaics" 55th Annual Technical Conference Proceedings Apr. 28-May 3, 2012 (Year: 2012).*

De Luca et al. "A Study of Mechanical and Water Vapor Barrier Performances for Flexible Organic Solar Cells Protecting Coating" 55th Annual Technical Conference Proceedings Apr. 28-May 3, 2012 (Year: 2012).*

Ricci et al. "Influence of Argon and Nitrogen Admixture in HMDSO/O2 Plasmas onto Powder Formation" Plasma Process. Polym. 2010, 7. (Year: 2010).*

Anonymous "Circuit Board Soldering through Conformal Coating," Research Disclosure, Mason Publications, Sept 1, 1998, vol. 93, No. 68.

Arkles "Hydrophobicity, Hydrophilicity and Silanes," Paintings and Coatings Magazine, Jan. 2006, pp. 114-135.

Barni et al. "Characterization fo the Chemical Kinetics in an O2/HMDSO RF Plasma for Material Processing," Advances in Physical Chemistry, Oct. 2012, 6 pages.

Cabrera et al. "Surface Analysis of copper, Brass, and Steel Foils Exposed to Flurine Containing Atmosphere," J. Vac. Sci. Technol. A8(6), Dec. 1990, pp. 3988-3996.

Coclite "Flexible Cross-linked Organosilicon Thin Films by Initiated Chemical Vapor Deposition," Macromolecules, 2009, pp. 8138-8145, vol. 42.

Coclite "Global and Local Planarization of Surface Roughness by CVD Organosilicon Polymer for Barrier Applications," Journal of Applied Physics, 2012, 7 pages, vol. 111.

Coclite et al. "Initiated PECVD of Oganosilicon Coatings: A New Strategy to Enchnace Monomer Structure Retention," Plasma Processes and Polymer, 2012, pp. 425-434, vol. 9.

Coclite et al. "Mechnically Robust Silica-like Coatings Deposited by Microwave Plasmas for Barrier Application," J. Vac. Sci. and Technol. A, 2012, 9 pages.

Coclite et al. "Multilayer Barrier Coatings for Organic Photovoltaics," 55th Annual Tech Conference Proceedings, Societ of Vacuum Coaters, 2012, pp. 560-563.

Coclite et al. "On the Relationship Between the Structure and the Barrier Performace of Plasma Deposited Silicon Dioxide-like Films," JJ, Surface Coatings and Technology, 2010, pp. 4012-4017, vol. 204.

Coclite et al. "Single-Chamber Deposition of Multilayer Barriers by Plasma Enhanced and Initiated Chemical Vapor Deposition of Organosilicones," Plasma Processes andr Polymers, 2010, pp. 561-570, vol. 7.

Deltschew et al. "Plasma Treatment Process for Fluxless Reflow Sldering," Surface and Coating Technology 142-144, 2001, pp. 803-807.

Deluca et al. "A Study of Mechinical and Water Vapor Barrier Performances for Flexible Organic Solar Cell Protecting Coatings," 55th Annual Tech Conference Proceedings, Society of Vacuum Coaters, 2012, pp. 569-574.

Dupuis et al. "Impact of PECVD SiON Stoichiometry and Post-annealing on the Silicon Surface Passivation," Thin Solid Films, 2008, pp. 6954-6958.

European Patent Office, International Search Report and Written Opinion for PCT International Application No. PCT/GB2016/050125, Apr. 26, 2017, 10 pages.

European Patent Office, International Search Report and Written Opinion for PCT International Application No. PCT/GB2016/050590, May 22, 2017, 12 pages.

(56) References Cited

OTHER PUBLICATIONS

European Patent Office, International Search Report and Written Opinion for PCT International Application No. PCT/GB2016/051702, Aug. 29, 2016, 10 pages.
European Patent Office, International Search Report and Written Opinion for PCT International Application No. PCT/GB2016/052503, Nov. 7, 2016, 15 pages.
European Patent Office, International Search Report and Written Opinion for PCT International Application No. PCT/GB2017/053720, Apr. 23, 2018, 11 pages.
Oliver et al. "An Improved Technique for Determining Hardness and Elastic Modulus Using Load and Displacement Sensing Indentation Experiments," J. Mater. Res., Jun. 1992, pp. 1564-1583, vol. 7.
Stetter et al. "Sensors, Chemical Sensors, Electrochemical Sensors, and ECS," Journal of the Electrochemical Society, 2003, pp. S11-S16, vol. 150, No. 2.
Wolter et al. "Plasma Treatment Process for Fluxless Reflow Soldering," Electronic Components and Technology Conference, 2001, pp. 1295-1298.
U.S. Appl. No. 16/466,743, Aug. 6, 2021, Office Action.
U.S. Appl. No. 16/466,743, Oct. 5, 2022, Office Action.
U.S. Appl. No. 16/466,743, Jun. 24, 2022, Final Office Action.
U.S. Appl. No. 16/466,743, Feb. 1, 2023, Final Office Action.
U.S. Appl. No. 16/466,743, Aug. 6, 2021, Restriction Requirement.

\* cited by examiner

PROTECTIVE COATING

FIELD OF THE INVENTION

The present invention relates to a protective coating for substrates, such as the external cases of electrical devices or printed circuit boards, and to methods for preparing the protective coating.

BACKGROUND TO THE INVENTION

Many devices, particularly electrical devices such as mobiles phones, are highly susceptible to both moisture-damage and mechanical-damage. The casing of such devices provides some protection from these problems, but that protection is only partial and the casings tend to become damage and unattractive over time.

Recently, conformal coatings have been applied by plasma deposition to the printed circuit boards (PCBs) of such electrical devices, in order to protect their active electronic parts from, for example, any water or sweat ingress (see, for example, WO 2011/104500 or WO 2013/132250). While these plasma-deposited conformal coatings are good moisture barriers, and prevent water/sweat ingress, they are generally soft and accordingly suffer from wear and have low mechanical resistance. These plasma-deposited conformal coatings are thus not suitable for use in situations where they will be exposed to mechanical damage, since the coatings will generally be damaged quickly (which will prevent tem acting as moisture barriers) and will not also not protect the underlying substrate from mechanical damage.

It would therefore be desirable to provide protective coatings to substrates, such as the casings of electrical devices, that act as both mechanical and moisture barriers whilst not detracting from the aesthetic appeal of the device.

SUMMARY OF THE INVENTION

The present inventors have surprisingly found that plasma deposition can be used to prepare coatings that protect the underlying substrate from both mechanical damage and moisture damage. The protective coatings are transparent, and thus do not detract from the aesthetic appeal of the underlying substrate. The protective coatings are resilient to wear and tear, and thus can remain intact for long periods of time on the substrate. The protective coatings have a moisture-barrier layer and a mechanical-protective layer separate by a gradient layer. The mechanical-protective and gradient layer do not prevent the moisture-barrier layer from protecting the substrate from moisture damage, and in particular do not cause it to delaminate or otherwise stop functioning. The mechanical-protective and gradient layer simultaneously protect both the underlying substrate and the moisture-barrier layer from mechanical damage. The resulting protective coatings thus provide effective protection from both mechanical damage and moisture damage.

The present invention accordingly provides a method for depositing a protective coating onto a substrate, wherein:
the protective coating comprises (i) a moisture-barrier layer which is in contact with the substrate and which comprises a first sub-layer, optionally one or more intermediate sub-layers, and a final sub-layer, (ii) a mechanical-protective layer which is inorganic, and (iii) a gradient layer interposing the moisture-barrier layer and the mechanical-protective layer; and the method comprises:
(a) depositing the first sub-layer of the moisture-barrier layer onto the substrate by plasma-deposition of a precursor mixture (A) comprising an organosilicon compound, a fluorohydrocarbon or a compound of formula (X);

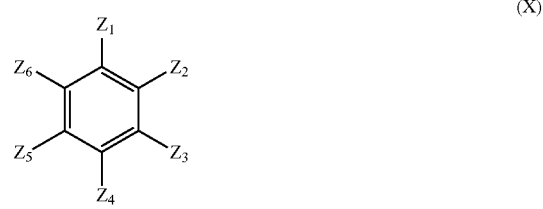

wherein:
$Z_1$ represents $C_1$-$C_3$ alkyl or $C_2$-$C_3$ alkenyl;
$Z_2$ represents hydrogen, $C_1$-$C_3$ alkyl or $C_2$-$C_3$ alkenyl;
$Z_3$ represents hydrogen, $C_1$-$C_3$ alkyl or $C_2$-$C_3$ alkenyl;
$Z_4$ represents hydrogen, $C_1$-$C_3$ alkyl or $C_2$-$C_3$ alkenyl;
$Z_5$ represents hydrogen, $C_1$-$C_3$ alkyl or $C_2$-$C_3$ alkenyl; and
$Z_6$ represents hydrogen, $C_1$-$C_3$ alkyl or $C_2$-$C_3$ alkenyl;

(b) depositing, when present, the one or more intermediate sub-layers of the moisture-barrier, each by plasma-deposition of a precursor mixture (B) comprising an organosilicon compound, a fluorohydrocarbon or a compound of formula (X);
(c) depositing the final sub-layer of the moisture barrier layer by plasma-deposition of a precursor mixture (C) comprising an organosilicon compound, a fluorohydrocarbon or a compound of formula (X);
(d) depositing the gradient-layer onto the final sub-layer of the moisture-barrier layer by plasma-deposition of a precursor mixture (D) which comprises the components of both precursor mixtures (C) and (E); and
(e) depositing the mechanical-protective layer onto the gradient-layer by plasma-deposition of a precursor mixture (E) comprising an organosilicon compound.

The invention further provides a substrate with a protective coating which is obtainable by the method of the invention.

DETAILED DESCRIPTION OF THE INVENTION

Figure 1:
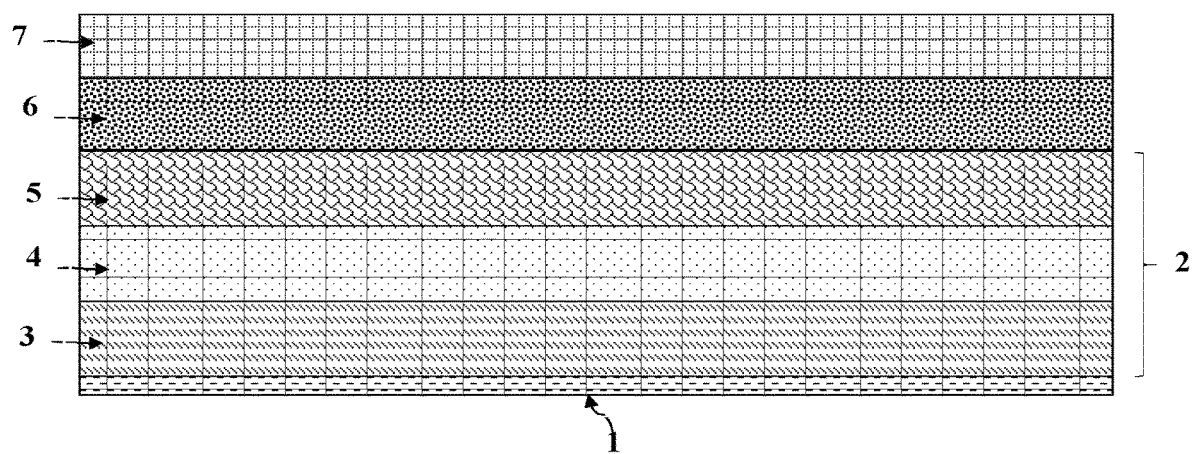
FIG. 1 shows a cross-section through a protective coating according to the invention, and is described in further detail below.

The protective coatings of the invention have (i) a moisture-barrier layer which is in contact with the substrate and which comprises a first sub-layer, optionally one or more intermediate sub-layers, and a final sub-layer, (ii) a mechanical-protective layer which is inorganic, and (iii) a gradient layer interposing the moisture-barrier layer and the mechanical-protective layer. All of the layers of the protective coatings of the invention are prepared by plasma deposition.

Plasma Deposition Process

The layers present in the protective coatings of the invention are prepared by plasma deposition, typically plasma enhanced chemical vapour deposition (PECVD) or plasma enhanced physical vapour deposition (PEPVD), preferably PECVD, of precursor mixtures. The plasma deposition process is typically carried out at a reduced pressure, typically 0.001 to 10 mbar, preferably 0.01 to 1 mbar, for example about 0.7 mbar. The deposition reactions occur in situ on the surface of external casing of the electrical device, or on the surface of layers that have already been deposited.

Plasma deposition is typically carried out in a reactor that generates plasma which comprises ionized and neutral feed gases/precursors, ions, electrons, atoms, radicals and/or other plasma generated neutral species. A reactor typically comprises a chamber, a vacuum system, and one or more energy sources, although any suitable type of reactor configured to generate plasma may be used. The energy source may include any suitable device configured to convert one or more gases to a plasma. Preferably the energy source comprises a heater, radio frequency (RF) generator, and/or microwave generator.

Plasma deposition results in a unique class of materials which cannot be prepared using other techniques. Plasma deposited materials have a highly disordered structure and are generally highly cross-linked, contain random branching and retain some reactive sites. These chemical and physical distinctions are well known and are described, for example in *Plasma Polymer Films, Hynek Biederman, Imperial College Press* 2004 *and Principles of Plasma Discharges and Materials Processing*, 2$^{nd}$ *Edition, Michael A. Lieberman, Alan J. Lichtenberg, Wiley* 2005.

Typically, the substrate is placed in the chamber of a reactor and a vacuum system is used to pump the chamber down to pressures in the range of $10^{-3}$ to 10 mbar. One or more gases is typically then injected (at controlled flow rate) into the chamber and an energy source generates a stable gas plasma. One or more precursor compounds is typically then be introduced, as gases and/or vapours, into the plasma phase in the chamber. Alternatively, the precursor compound may be introduced first, with the stable gas plasma generated second. When introduced into the plasma phase, the precursor compounds are typically decomposed (and/or ionized) to generate a range of active species (i.e. radicals) in the plasma that is deposited onto and forms a layer on the exposed surface of the substrate.

The exact nature and composition of the material deposited typically depends on one or more of the following conditions (i) the plasma gas selected; (ii) the particular precursor compound(s) used; (iii) the amount of precursor compound(s) [which may be determined by the combination of the pressure of precursor compound(s), the flow rate and the manner of gas injection]; (iv) the ratio of precursor compound(s); (v) the sequence of precursor compound(s); (vi) the plasma pressure; (vii) the plasma drive frequency; (viii) the power pulse and the pulse width timing; (ix) the coating time; (x) the plasma power (including the peak and/or average plasma power); (xi) the chamber electrode arrangement; and/or (xii) the preparation of the incoming substrate.

Typically the plasma drive frequency is 1 kHz to 4 GHz. Typically the plasma power density is 0.001 to 50 W/cm$^2$, preferably 0.01 W/cm$^2$ to 0.02 W/cm$^2$, for example about 0.0175 W/cm$^2$. Typically the mass flow rate is 5 to 1000 sccm, preferably 5 to 20 sccm, for example about 10 sccm. Typically the operating pressure is 0.001 to 10 mbar, preferably 0.01 to 1 mbar, for example about 0.7 mbar. Typically the coating time is 10 seconds to >60 minutes, for example 10 seconds to 60 minutes.

Plasma processing can be easily scaled up, by using a larger plasma chamber. However, as a skilled person will appreciate, the preferred conditions will be dependent on the size and geometry of the plasma chamber. Thus, depending on the specific plasma chamber that is being used, it may be beneficial for the skilled person to modify the operating conditions.

Precursor Mixtures Containing an Organosilicon Compound

Some layers of the protective coatings described herein are formed from a precursor mixture that comprises an organosilicon compound. Such precursor mixtures optionally further comprises reactive gas(es) (such as $O_2$) and/or non-reactive gas (such as Ar). Typically the precursor mixture consists, or consists essentially, of the organosilicon compound, the optional reactive gas(es) and optional non-reactive gas(es).

The resulting layers deposited have general formula $SiO_xH_yC_zF_aN_b$, wherein the values of x, y, z a and b depend upon (i) the specific organosilicon compound used, and (ii) whether or not a reactive gas is present and the identify of that reactive gas.

When the organosilicon compounds are plasma deposited in the absence of an excess of oxygen and nitrogen-containing reactive gas (such as $NH_3$, $O_2$, $N_2O$ or $NO_2$), the resulting layer will be organic in nature and will be of general formula $SiO_xH_yC_zN_b$. The values of y and z will be greater than 0. The values of x and b will be greater than 0 if O or N is present in the precursor mixture, either as part of the organosilicon compound(s) or as a reactive gas.

When the organosilicon compounds are plasma deposited in the presence of oxygen-containing reactive gas (such as $O_2$ or $N_2O$ or $NO_2$), the hydrocarbon moieties in the organosilicon precursor react with the oxygen-containing reactive gas to form $CO_2$ and $H_2O$. This will increase the inorganic nature of the resulting layer. If sufficient oxygen-containing reactive gas is present, all of the hydrocarbon moieties may be removed, such that resulting layer is substantially inorganic/ceramic in nature (in which in the general formula $SiO_xH_yC_zN_b$, y, z and b will have negligible values tending to zero). The hydrogen content can be reduced further by increasing RF power density and decreasing plasma pressure, thus enhancing the oxidation process and leading to a dense inorganic layer (in which in the general formula $SiO_xH_yC_zN_b$, x is as high as 2 with y, z and b will have negligible values tending to zero).

Typically, the precursor mixture comprises one organosilicon compound, but it may be desirable under some circumstances to use two or more different organosilicon compounds, for example two, three or four different organosilicon compounds.

The organosilicon compound may be a compound of formula (I):

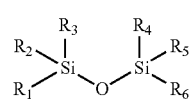

(I)

wherein each of $R_1$ to $R_6$ independently represents a $C_1$-$C_6$ alkyl group, a $C_2$-$C_6$ alkenyl group or hydrogen, provided that at least one of $R_1$ to $R_6$ does not represent hydrogen. Preferably, each of $R_1$ to $R_6$ independently represents a $C_1$-$C_3$ alkyl group, a $C_2$-$C_4$ alkenyl group or hydrogen, for example methyl, ethyl, vinyl, allyl or hydrogen, provided that at least one of $R_1$ to $R_6$ does not represent hydrogen. Preferably at least two or three, for example four, five or six, of $R_1$ to $R_6$ do not represent hydrogen. Preferred examples include hexamethyldisiloxane (HMDSO), tetramethyldisiloxane (TMDSO), 1,3-divinyltetramethyldisiloxane (DVTMDSO) and hexavinyldisiloxane (HVDSO). Hexamethyldisiloxane (HMDSO) and tetramethyldisiloxane (TMDSO) are particularly preferred, with hexamethyldisiloxane (HMDSO) most preferred.

Alternatively, the organosilicon compound may be a compound of formula (II):

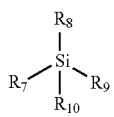

(II)

wherein each of $R_7$ to $R_{10}$ independently represents a $C_1$-$C_6$ alkyl group, a $C_1$-$C_6$ alkoxy group, a $C_2$-$C_6$ alkenyl group, hydrogen, or a —$(CH_2)_{1-4}$NR'R" group in which R' and R" independently represent a $C_1$-$C_6$ alkyl group. Preferably each of $R_7$ to $R_{10}$ independently represents a $C_1$-$C_3$ alkyl group, $C_1$-$C_3$ alkoxy group, a $C_2$-$C_4$ alkenyl group, hydrogen or a —$(CH_2)_{2-3}$NR'R" group in which R' and R" independently represent a methyl or ethyl group, for example methyl, ethyl, isopropyl, methoxy, ethoxy, vinyl, allyl, hydrogen or —$CH_2CH_2CH_2N(CH_2CH_3)_2$. Preferably at least one of $R_7$ to $R_{10}$ does not represent hydrogen. Preferred examples include allyltrimethylsilane, allyltrimethoxysilane (ATMOS), tetraethylorthosilicate (TEOS), 3-(diethylamino)propyl-trimethoxysilane, trimethylsilane (TMS), triisopropylsilane (TiPS) and silane.

A preferred sub-class of compounds of formula (II) are those which do not contain oxygen, nitrogen or fluorine, and thus can be used form oxygen-, nitrogen- and fluorine-free compounds of general formula $SiH_yC_z$. In this preferred sub-class, $R_7$ to $R_{10}$ independently represents a $C_1$-$C_6$ alkyl group, a $C_2$-$C_6$ alkenyl group or hydrogen. Preferably each of $R_7$ to $R_{10}$ independently represents a $C_1$-$C_3$ alkyl group, a $C_2$-$C_4$ alkenyl group or hydrogen. Preferably at least one of $R_7$ to $R_{10}$ does not represent hydrogen. Preferred examples include silane, allyltrimethylsilane, trimethylsilane (TMS) and triisopropylsilane (TiPS).

Alternatively, the organosilicon compound may be a cyclic compound of formula (III):

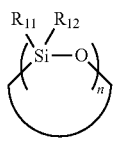

(III)

wherein n represents 3 or 4, and each of $R_{11}$ and $R_{12}$ each independently represents a $C_1$-$C_6$ alkyl group, a $C_2$-$C_6$ alkenyl group or hydrogen, provided that at least one of $R_{11}$ and $R_{12}$ does not represent hydrogen. Preferably, each of $R_{11}$ and $R_{12}$ independently represents a $C_1$-$C_3$ alkyl group, a $C_2$-$C_4$ alkenyl group or hydrogen, for example methyl, ethyl, vinyl, allyl or hydrogen, provided that at least one of $R_{11}$ and $R_{12}$ does not represent hydrogen. Preferred examples include trivinyl-trimethyl-cyclotrisiloxane ($V_3D_3$), tetravinyl-tetramethyl-cyclotetrasiloxane ($V_4D_4$), tetramethylcyclotetrasiloxane (TMCS) and octamethylcyclotetrasiloxane (OMCTS).

Alternatively, the organosilicon compound may be a compound of formula (IV):

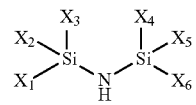

(IV)

wherein each of $X_1$ to $X_6$ independently represents a $C_1$-$C_6$ alkyl group, a $C_2$-$C_6$ alkenyl group or hydrogen, provided that at least one of $X_1$ to $X_6$ does not represent hydrogen. Preferably each of $X_1$ to $X_6$ independently represents a $C_1$-$C_3$ alkyl group, a $C_2$-$C_4$ alkenyl group or hydrogen, for example methyl, ethyl, vinyl, allyl or hydrogen, provided that at least one of $X_1$ to $X_6$ does not represent hydrogen. Preferably at least two or three, for example four, five or six, of $X_1$ to $X_6$ do not represent hydrogen. A preferred example is hexamethyldisilazane (HMZDSN).

Alternatively, the organosilicon compound may be a cyclic compound of formula (V):

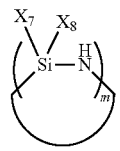

(V)

wherein m represents 3 or 4, and each of $X_7$ and $X_8$ independently represents a $C_1$-$C_6$ alkyl group, a $C_2$-$C_6$ alkenyl group or hydrogen, provided that at least one of $X_7$ and $X_8$ does not represent hydrogen. Preferably, each of $X_7$ and $X_8$ independently represents a $C_1$-$C_3$ alkyl group, a $C_2$-$C_4$ alkenyl group or hydrogen, for example methyl, ethyl, vinyl, allyl or hydrogen, provided that at least one of $X_7$ and $X_8$ does not represent hydrogen. A preferred example is 2,4,6-trimethyl-2,4,6-trivinylcyclotrisilazane.

Alternatively, the organosilicon compound may be a compound of formula (VI):

$$H_a(X^9)_b Si(N(X^{10})_2)_{4-a-b}$$ (VI)

wherein $X^9$ and $X^{10}$ independently represent $C_1$-$C_6$ alkyl groups, a represents 0, 1 or 2, b represents 1, 2 or 3, and the sum of a and b is 1, 2 or 3. Typically, $X^9$ and $X^{10}$ represent a $C_1$-$C_3$ alkyl group, for example methyl or ethyl. Preferred examples are dimethylamino-trimethylsilane (DMATMS), bis(dimethylamino)dimethylsilane (BDMADMS) and tris(dimethylamino)methylsilane (TDMAMS).

Alternatively, the organosilicon compound may be a compound of formula (VII):

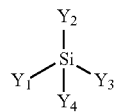

(VII)

wherein each of $Y_1$ to $Y_4$ independently represents a $C_1$-$C_8$ haloalkyl group, a $C_1$-$C_6$ alkyl group, $C_1$-$C_6$ alkoxy group, or a $C_2$-$C_6$ alkenyl group or hydrogen, provided that at least one of $Y_1$ to $Y_4$ represents a $C_1$-$C_8$ haloalkyl group. Preferably, each of $Y_1$ to $Y_4$ independently represents a $C_1$-$C_3$ alkyl group, $C_1$-$C_3$ alkoxy group, a $C_2$-$C_4$ alkenyl group or a $C_1$-$C_8$ haloalkyl group, for example methyl, ethyl, methoxy, ethoxy, vinyl, allyl, trifluoromethyl or 1H,1H,2H,2H-perfluorooctyl, provided that at least one of $Y_1$ to $Y_4$ represents a haloalkyl group. Preferred examples are trimethyl(trifluoromethyl)silane and 1H,1H,2H,2H-perfluorooctyltriethoxysilane.

Preferably the organosilicon compound is hexamethyldisiloxane (HMDSO), tetramethyldisiloxane (TMDSO), 1,3-divinyltetramethyldisiloxane (DVTMDSO), hexavinyldisiloxane (HVDSO allyltrimethylsilane, allyltrimethoxysilane (ATMOS), tetraethylorthosilicate (TEOS), 3-(diethylamino) propyl-trimethoxysilane, trimethylsilane (TMS), triisopropylsilane (TiPS), trivinyl-trimethyl-cyclotrisiloxane ($V_3D_3$), tetravinyl-tetramethyl-cyclotetrasiloxane ($V_4D_4$), tetramethylcyclotetrasiloxane (TMCS), octamethylcyclotetrasiloxane (OMCTS), hexamethyldisilazane (HMDSN), 2,4,6-trimethyl-2,4,6-trivinylcyclotrisilazane, dimethylamino-trimethylsilane (DMATMS), bis(dimethylamino)dimethylsilane (BDMADMS), or tris(dimethylamino)methylsilane (TDMAMS). Hexamethyldisiloxane (HMDSO) and tetramethyldisiloxane (TMDSO) are particularly preferred, with hexamethyldisiloxane (HMDSO) most preferred.

The precursor mixture containing an organosilicon compound optionally further comprises reactive gas(es). The reactive gas is selected from $O_2$, $N_2O$, $NO_2$, $H_2$, $NH_3$, $N_2$ $SiF_4$ and/or hexafluoropropylene (HFP). These reactive gases are generally involved chemically in the plasma deposition mechanism, and so can be considered to be co-precursors.

$O_2$, $N_2O$ and $NO_2$ are oxygen-containing co-precursors, and are typically added in order to increase the inorganic character of the resulting layer deposited. This process is discussed above. $N_2O$ and $NO_2$ are also nitrogen-containing co-precursors, and are typically added in order to increase additionally the nitrogen content of the resulting layer deposited (and consequently the value of b in the general formula $SiO_xH_yC_zF_aN_b$ is increased).

$H_2$ is a reducing co-precursor, and is typically added in order to reduce the oxygen content (and consequently the value of x in the general formula $SiO_xH_yC_zF_aN_b$) of the resulting layer deposited. Under such reducing conditions, the carbon and hydrogen are also generally removed from the resulting layer deposited (and consequently the values of y and z in the general formula $SiO_xH_yC_zF_aN_b$ are also reduced). Addition of $H_2$ as a co-precursor increases the level of cross-linking in the resulting layer deposited.

$N_2$ is a nitrogen-containing co-precursor, and is typically added in order to increase the nitrogen content of the resulting layer deposited (and consequently the value of b in the general formula $SiO_xH_yC_zF_aN_b$ is increased).

$NH_3$ is also a nitrogen-containing co-precursor, and so is typically added in order to increase the nitrogen content of the resulting layer deposited (and consequently the value of b in the general formula $SiO_xH_yC_zF_aN_b$ is increased). However, $NH_3$ additionally has reducing properties. As with the addition of $H_2$, this means that when $NH_3$ is used as a co-precursor, oxygen, carbon and hydrogen are generally removed from the resulting layer deposited (and consequently the values of x, y and z in the general formula $SiO_xH_yC_zF_aN_b$ are reduced). Addition of $NH_3$ as a co-precursor increases the level of cross-linking in the resulting layer deposited. The resulting layer tends towards a silicon nitride structure.

$SiF_4$ and hexafluoropropylene (HFP) are fluorine-containing co-precursors, and typically added in order to increase the fluorine content of the resulting layer deposited (and consequently the value of a in the general formula $SiO_xH_yC_zF_aN_b$ is increased).

A skilled person can easily adjust the ratio of reactive gas to organosilicon compound(s) at any applied power density, in order to achieve the desired modification of the resulting layer deposited.

The precursor mixture also optionally further comprises non-reactive gas(es). The non-reactive gas is He, Ar or Kr. The non-reactive gas is not involved chemically in the plasma deposition mechanism, but does generally influence the physical properties of the resulting material. For example, addition of He, Ar or Kr will generally increase the density of the resulting layer, and thus its hardness. Addition of He, Ar or Kr also increases cross-linking of the resulting deposited material.

Precursor Mixtures Containing a Hydrocarbon Compounds of Formula (X)

Some layers of the protective coatings described herein are hydrocarbon polymers of formula $C_mH_n$ formed from a precursor mixture that comprises a hydrocarbon compound of formula (X). The precursor mixture optionally further comprises reactive gas(es) (such as $NH_3$) and/or non-reactive gas(es) (such as Ar). Typically the precursor mixture consists, or consists essentially, of the hydrocarbon compound of formula (X), the optional reactive gas(es) and optional non-reactive gas(es).

Hydrocarbon compounds of formula (X) have the following structure:

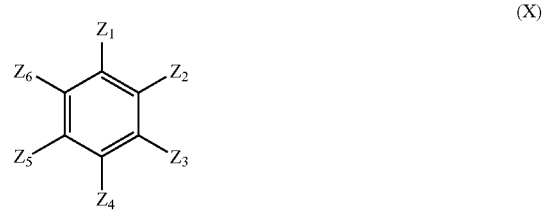

(X)

wherein $Z_1$ represents $C_1$-$C_3$ alkyl or $C_2$-$C_3$ alkenyl; $Z_2$ represents hydrogen, $C_1$-$C_3$ alkyl or $C_2$-$C_3$ alkenyl; $Z_3$ represents hydrogen, $C_1$-$C_3$ alkyl or $C_2$-$C_3$ alkenyl; $Z_4$ represents hydrogen, $C_1$-$C_3$ alkyl or $C_2$-$C_3$ alkenyl; $Z_5$ represents hydrogen, $C_1$-$C_3$ alkyl or $C_2$-$C_3$ alkenyl; and $Z_6$ represents hydrogen, $C_1$-$C_3$ alkyl or $C_2$-$C_3$ alkenyl.

Typically, $Z_1$ represents methyl, ethyl, or vinyl. Typically, $Z_2$ represents hydrogen, methyl, ethyl, or vinyl. Typically, $Z_3$ represents hydrogen, methyl, ethyl or vinyl. Typically, $Z_4$ represents hydrogen, methyl, ethyl or vinyl. Typically, $Z_5$ represents hydrogen, methyl, ethyl or vinyl, preferably hydrogen. Typically, $Z_6$ represents hydrogen, methyl, ethyl or vinyl, preferably hydrogen.

Preferably, $Z_5$ and $Z_6$ represent hydrogen.

More preferably, $Z_1$ represents methyl, ethyl or vinyl, $Z_2$ represents hydrogen, methyl, ethyl or vinyl, $Z_3$ represents hydrogen, methyl, ethyl or vinyl, $Z_4$ represents hydrogen, methyl, ethyl or vinyl, $Z_5$ represents hydrogen and $Z_6$ represents hydrogen.

It is generally preferred that two of $Z_2$ to $Z_4$ represent hydrogen.

Preferred hydrocarbon compounds of formula (X) are 1,4-dimethylbenzene, 1,3-dimethylbenzene, 1,2-dimethylbenzene, toluene, 4-methyl styrene, 3-methyl styrene, 2-methyl styrene, 1,4-divinyl benzene, 1,3-divinyl benzene, 1,2-divinyl benzene, 1,4-ethylvinylbenzene, 1,3-ethylvinylbenze and 1,2-ethylvinylbenzene.

1,4-dimethylbenzene is particularly preferred.

Divinyl benzenes are also particularly preferred, and are typically used in the form of a mixture of 1,4-divinyl benzene, 1,3-divinyl benzene and 1,2-divinyl benzene.

Typically, the precursor mixture comprises one compound of formula (X), but it may be desirable under some circumstances to use two or more different compounds of formula (X), for example two, three or four different compounds of formula (X).

The precursor mixture containing a hydrocarbon compound of formula (X) optionally further comprises reactive gas(es). The reactive gas is selected from $N_2O$, $NO_2$, $NH_3$, $N_2$, $CH_4$, $C_2H_6$, $C_3H_6$ and/or $C_3H_8$. These reactive gases are generally involved chemically in the plasma deposition mechanism, and so can be considered to be co-precursors.

A skilled person can easily adjust the ratio of reactive gas to compound of formula (X) at any applied power density, in order to achieve the desired modification of the resulting layer deposited.

The precursor mixture containing a hydrocarbon compounds of formula (X) also optionally further comprises non-reactive gas(es). The non-reactive gas is He, Ar or Kr, with He and Ar preferred. The non-reactive gas is not involved chemically in the plasma deposition mechanism, but does generally influence the physical properties of the resulting material. For example, addition of He, Ar or Kr will generally increase the density of the resulting layer, and thus its hardness. Addition of He, Ar or Kr also increases cross-linking of the resulting deposited material.

Precursor mixtures containing a fluorohydrocarbon Some layers of the protective coatings described herein are formed from a precursor mixture that comprises a fluorohydrocarbon. The precursor mixture optionally further comprises reactive gas(es) (such as $NH_3$) and/or non-reactive gas(es) (such as Ar). Typically the precursor mixture consists, or consists essentially, of the fluorohydrocarbon, the optional reactive gas(es) and optional non-reactive gas(es).

A fluorohydrocarbon is a hydrocarbon material comprising fluorine atoms. Preferred fluorohydrocarbons are perfluoroalkanes, perfluoroalkenes, perfluoroalkynes, fluoroalkanes, fluoroalkenes and fluoroalkynes, wherein said compounds preferably contain up to 10 carbon atoms, more preferably up to five carbon atoms. Preferred examples include $CF_4$, $C_2F_4$, $C_2F_6$, $C_3F_6$, $C_3F_8$ and $C_4F_8$. A most preferred fluorohydrocarbon is hexafluoropropylene ($C_3F_6$).

Typically, the precursor mixture comprises one fluorohydrocarbon, but it may be desirable under some circumstances to use two or more different fluorohydrocarbons, for example two, three or four different fluorohydrocarbons.

The precursor mixture containing a fluorohydrocarbon optionally further comprises reactive gas(es) such as $H_2$, $N_2$, $CH_4$ and/or $NH_3$. These reactive gases are generally involved chemically in the plasma deposition mechanism, and so can be considered to be co-precursors.

A skilled person can easily adjust the ratio of reactive gas to fluorohydrocarbon at any applied power density, in order to achieve the desired modification of the resulting layer deposited.

The precursor mixture containing a fluorohydrocarbon also optionally further comprises non-reactive gas(es). The non-reactive gas is He, Ar or Kr, with He and Ar preferred. The non-reactive gas is not involved chemically in the plasma deposition mechanism, but does generally influence the physical properties of the resulting material. For example, addition of He, Ar or Kr will generally increase the density of the resulting layer, and thus its hardness. Addition of He, Ar or Kr also increases cross-linking of the resulting deposited material.

Structure and Properties of the Protective Coating

The protective coating of the invention comprises (i) a moisture-barrier layer which is in contact with the substrate and which comprises a first sub-layer, optionally one or more intermediate sub-layers, and a final sub-layer, (ii) a mechanical-protective layer which is inorganic, and (iii) a gradient layer interposing the moisture-barrier layer and the mechanical-protective layer. The protective coating as a whole is transparent, and so each constituent layer is also transparent. Layers (i) to (iii) are discussed in turn below.

(i) The Moisture-Barrier Layer

The moisture-barrier layer prevents moisture, typically in the form of water vapour, breaching the protective coating and damaging the underlying substrate. The moisture-barrier layer's properties can be assessed by measuring the water vapour transmission rate (WVTR) using standard techniques, such as a MOCON test. Typically, the WVTR of the moisture-barrier layer is from 10 $g/m^2$/day down to 0.001 $g/m^2$/day.

The moisture-barrier layer comprises a first sub-layer, optionally one or more intermediate sub-layers, and a final sub-layer. The moisture-barrier layer is thus a multi-layer coating comprising at least two sub-layers. Typically, the moisture-barrier layer has from two to thirteen sub-layers, preferably three to eleven sub-layers or five to nine sub-layers. Thus, the moisture-barrier layer may have three, four, five, six, seven, eight, nine, ten, eleven, twelve or thirteen sub-layers.

Each sub-layer is prepared by plasma-deposition of a precursor mixture comprising an organosilicon compound, a fluorohydrocarbon or a compound of formula (X). The first sub-layer is prepared by plasma-deposition of a precursor mixture (A). The final sub-layer is prepared by plasma-deposition of a precursor mixture (C). The optional intermediate sub-layers, where present, are each prepared by plasma-deposition of a precursor mixture (B). When there are two or more such sub-layers, the precursor mixture (B) for each sub-layer may be the same or different.

When a sub-layer is prepared by plasma deposition of an organosilicon compound (in the presence or absence of reactive gases and/or non-reactive gases), the sub-layer has general formula $SiO_xH_yC_zF_aN_b$, wherein the values of x, y, z, a and b depend upon (a) the specific organosilicon compound(s) used, (b) whether or not a reactive gas is present and the identify of that reactive gas, and (c) whether or not a non-reactive gas is present, and the identify of that non-reactive gas. For example, if no fluorine or nitrogen is present in the organosilicon compound(s) and a reactive gas containing fluorine or nitrogen is not used, then the values of a and b will be 0. As will be discussed in further detail below, the values of x, y, z, a and b can be tuned by selecting appropriate organosilicon compound(s) and/or reactive gases, and the properties of each layer and the overall coating controlled accordingly. For the avoidance of doubt, it will be appreciated that each sub-layer prepared from an organosilicon compound may have organic or inorganic character, depending upon the exact precursor mixture, despite the organic nature of the precursor mixtures used to form those sub-layers. In an organic sub-layer of general formula $SiO_xH_yC_zF_aN_b$, the values of y and z will be greater than zero, whereas in an inorganic layer of general formula $SiO_xH_yC_zF_aN_b$ the values of y and z will tend towards zero.

The organic nature of a layer can easily be determined by a skilled person using routine analytical techniques, such as by detecting the presence of carbon-hydrogen and/or carbon-carbon bonds using Fourier transform infrared spectroscopy. Similarly, the inorganic nature of a layer can easily be determined by a skilled person using routine analytical techniques, such as by detecting the absence of carbon-hydrogen and/or carbon-carbon bonds using Fourier transform infrared spectroscopy.

In some cases, it may be desirable to prepare a sub-layer by plasma deposition of an oxygen-, nitrogen- and fluorine-free organosilicon compound (in the presence or absence of reactive gases and/or non-reactive gases). The resulting sub-layer has general formula $SiH_yC_z$. Typical examples oxygen-, nitrogen- and fluorine-free organosilicon compound are silane, allyltrimethylsilane, trimethylsilane (TMS) and triisopropylsilane (TiPS), as discussed above in relation to compounds of formula (II). The carbon content can also be controlled by adding reactive gases (such as $H_2$ and $CH_4$), adding non-reactive gases (such as Ar, He and/or Kr) and/or by modifying the RF power. Generally, by increasing the RF power hydrogen content of the coating decreases and the coating tend to be denser and harder.

When a sub-layer is prepared by plasma deposition of a compound of formula (X) (in the presence or absence of reactive gases and/or non-reactive gases), the sub-layer is a polymeric hydrocarbon with general formula $C_mH_n$. The $C_mH_n$ layer is typically an amorphous polymeric hydrocarbon with a linear, branched and/or networked chain structure. Depending on the specific precursor and co-precursor (i.e. reactive gases and/or non-reactive gases) the $C_mH_n$ layer may contain aromatic rings in the structure. The values of m and n, the density of the polymer and/or presence aromatic rings can be tuned by varying the applied power to generate the plasma and by varying the flow of precursor and/or of the co-precursor. For example, by increasing the power the concentration of aromatic rings can be reduced and the density of the polymer can be increased. By increasing the ratio of the flow rate of the precursors over co-precursor (i.e. reactive gases and/or non-reactive gases) the density of aromatic rings can be increased.

When a sub-layer is prepared by plasma deposition of a fluorohydrocarbon (in the presence or absence of reactive gases and/or non-reactive gases), the sub-layer is typically an amorphous carbon-fluorine polymer with a linear, branched and/or networked chain structure. Depending on the specific precursor and co-precursor (i.e. reactive gases and/or non-reactive gases) the layer may contain aromatic rings in the structure. The density of the polymer and/or presence of aromatic rings can be tuned by varying the applied power to generate the plasma and by varying the flow of precursor and/or of the co-precursor. For example, by increasing the power the concentration of aromatic rings can be reduced and the density of the polymer can be increased. By increasing the ratio of the flow rate of the precursors over co-precursor (i.e. reactive gases and/or non-reactive gases) the density of aromatic rings can be increased.

The boundary between each sub-layer may be discrete or graded. Thus, all of the boundaries may be discrete, or all of the boundaries may be graded, or there may be both discrete and graded boundaries with the moisture-barrier layer.

A graded boundary between two sub-layers can be achieved by switching gradually over time during the plasma deposition process from the precursor mixture required to form the first of the two sub-layers to the precursor mixture required to form the second of the two sub-layers. The thickness of the graded region between the two sub-layers can be adjusted by altering the time period over which the switch from the first precursor mixture to the second precursor mixture occurs. A discrete boundary between two sub-layers can be achieved by switching immediately during the plasma deposition process from the precursor mixture required to form the first of the two sub-layers to the precursor mixture required to form the second of the two sub-layers.

Different sub-layers are deposited by varying the precursor mixture and/or the plasma deposition conditions in order to obtain sub-layers which have the desired properties. The properties of each individual sub-layer are selected such that the resulting moisture-barrier layer has the desired properties.

The thickness of the moisture-barrier layer will depend upon the number of sub-layers that are deposited, and the thickness of each sub-layer deposited. Typically, the thickness of each sub-layer is from 20 nm to 500 nm. The overall thickness of the moisture-barrier layer is of course dependent on the number of sub-layers, but is typically less than 5000 nm, and preferably 1000 nm to 3000 nm.

The thickness of each sub-layer can be easily controlled by a skilled person. Plasma processes deposit a material at a uniform rate for a given set of conditions, and thus the thickness of a sub-layer is proportional to the deposition time. Accordingly, once the rate of deposition has been determined, a sub-layer with a specific thickness can be deposited by controlling the duration of deposition.

The thickness of the moisture-barrier layer and each constituent sub-layer may be substantially uniform or may vary from point to point, but is preferably substantially uniform.

Thickness may be measured using techniques known to those skilled in the art, such as a profilometry, reflectometry or spectroscopic ellipsometry.

The moisture-barrier layer is typically relatively soft, with a nanohardness of 0.1 to 2 GPa, for example 0.2 to 0.9 GPa. Nanohardness can be measured as discussed below with regard to the mechanical-protective layer.

Three preferred classes of moisture-barrier layer (Moisture-barrier layers 1 to 3) used in the present invention are discussed in turn below.

Moisture-Barrier Layer 1

Moisture-barrier layer 1 comprises sub-layers that are either:

[i] prepared by plasma deposition of a precursor mixture comprising (a) a fluorohydrocarbon, (b) optionally $H_2$, $N_2$, $CH_4$ and/or $NH_3$, and (c) optionally He, Ar and/or Kr; or

[ii] prepared by plasma deposition of a precursor mixture comprising (a) a compound of formula (X), (b) optionally $NH_3$, $N_2O$, $N_2$, $NO_2$, $CH_4$, $C_2H_6$, $C_3H_6$ and/or $C_3H_8$, and (c) optionally He, Ar and/or Kr.

Typically, the first sub-layer of Moisture-barrier layer 1 is of type [i], with subsequent sub-layers alternating between type [ii] and type [i]. Preferred coatings have the structures [i][ii], [i][ii][i], [i][ii][i][ii], [i][ii][i][ii][i], [i][ii][i][ii][i][ii], [i][ii][i][ii][i][ii][i] and so on. Each layer of sub-type [i] can be the same or different and each sub-layer of type [ii] can be the same or different.

It is preferable that first sub-layer adheres well to the surface of the substrate. The exact precursor mixture that is required will depend upon the specific substrate, and a skilled person will be able to adjust the precursor mixture accordingly. However, sub-layers prepared by plasma-deposition of fluorohydrocarbons generally adhere well to most substrates. Accordingly, the first sub-layer of Moisture-barrier layer 1 is typically prepared by plasma-deposition onto the substrate of a precursor mixture (A1) comprising (a) a fluorohydrocarbon, (b) optionally $H_2$, $N_2$, $CH_4$ and/or $NH_3$, and (c) optionally He, Ar and/or Kr. The precursor mixture (A1) typically consists, consists essentially, of these components.

At least one of the final sub-layer or, where present, the intermediate sub-layers of Moisture-barrier layer 1 is a hydrocarbon polymer of formula $C_mH_n$ prepared by plasma deposition of a precursor mixture comprising a hydrocarbon compound of formula (X), (b) optionally $NH_3$, $N_2O$, $N_2$, $NO_2$, $CH_4$, $C_2H_6$, $C_3H_6$ and/or $C_3H_8$, and (c) optionally He, Ar and/or Kr. The precursor mixture typically consists, consists essentially, of these components.

A typical example of Moisture-barrier layer 1 is one in which (i) precursor mixture (A1) comprises a fluorohydrocarbon and (ii) precursor mixtures (C1) and, when present, (B1) comprise either a fluorohydrocabon or a compound of formula (X), provided that at least one of precursor mixtures (B1) or (C1) comprises a compound of formula (X).

Moisture-Barrier Layer 2

Moisture-barrier layer 2 comprises sub-layers that are each prepared by plasma deposition of a precursor mixture comprising (a) an organosilicon compound, (b) optionally $O_2$, $N_2O$, $NO_2$, $H_2$, $NH_3$ and/or $N_2$, and (c) optionally He, Ar and/or Kr. The precursor mixture typically consists, consists essentially, of these components.

It is preferable that first sub-layer adheres well to the surface of the substrate. The exact precursor mixture that is required will depend upon the specific substrate, and a skilled person will be able to adjust the precursor mixture accordingly. However, Si-based layers which are organic in character adhere best to most substrates. A Si-based layer with organic character, and which will have particular good adhesion to the substrate and to the next sub-layer in the moisture-barrier layer, can be achieved by using a precursor mixture that contains no, or substantially no, oxygen-containing reactive gas (i.e. no, or substantially no, or $O_2$, $N_2O$ or $NO_2$), and preferably also contains $H_2$, $NH_3$, $N_2$, Ar, He and/or Kr. It is thus preferable that first sub-layer of Moisture-barrier 2 is prepared from precursor mixture (A2) which comprises an organosilicon compound and no, or substantially no, $O_2$, $N_2O$ or $NO_2$, and more preferably additionally contains $H_2$, $NH_3$, $N_2$, Ar, He and/or Kr. The resulting coating will be organic in character and so will adhere well to the surface of the substrate.

Sub-layers which contain no, or substantially no, fluorine also typically adhere best to the surface of the substrate. A sub-layer which contains no, or substantially no, fluorine can be achieved by using a precursor mixture that contains no, or substantially no, fluorine-containing organosilicon compound and no, or substantially no, fluorine-containing reactive gas (ie. no, or substantially no, $SiF_4$ or HFP). It is thus preferable that the first sub-layer of Moisture-barrier 2 is prepared from precursor mixture (A2) that contains no, or substantially no, fluorine-containing organosilicon compound, $SiF_4$ or HFP.

It is particularly preferred that the first sub-layer of Moisture-barrier 2 is prepared from precursor mixture (A2) that contains no, or substantially no, $O_2$, $N_2O$, $NO_2$, fluorine-containing organosilicon compound, $SiF_4$ or HFP. The resulting sub-layer will be organic in character and contain no fluorine, and so will adhere well to the substrate.

It is preferred that at least one sub-layer of Moisture-barrier layer 2 is substantially inorganic in character and contains very little carbon, due to improved moisture barrier-properties. Such layers can be prepared by, for example, plasma deposition of a precursor mixture that comprises an organosilicon compound and an oxygen-containing reactive gas (ie. $O_2$, $N_2O$ or $NO_2$). Addition of a non-reactive gases such as He, Ar or Kr, use of a high RF power density and/or reducing the plasma pressure will also assist in forming a layer with good moisture barrier properties. It is therefore preferred that at least one of the final sub-layer or, where present, the intermediate sub-layers of Moisture-barrier layer 2 is prepared by plasma deposition of a precursor mixture comprising an organosilicon compound and $O_2$, $N_2O$ and/or $NO_2$, and preferably also He, Ar and/or Kr. Preferably the precursor mixture consists, or consists essentially, of these components.

It is also preferred that that at least one sub-layer of Moisture-barrier layer 2 contains nitrogen atoms, due to improved moisture barrier-properties. Such a layer can be prepared by using a nitrogen-containing organosilicon compound, typically a silazane or aminosilane precursor, such as the compounds of formula (IV) to (VI) defined above. Nitrogen atoms can also be introduced by including $N_2$, $NO_2$, $N_2O$ or $NH_3$ as a reactive gas in the precursor mixture. It is therefore preferred that at least one of the final sub-layer or, where present, the intermediate sub-layers of Moisture-barrier layer 2 is prepared plasma deposition of a precursor mixture comprising a nitrogen-containing organosilicon compound, or a precursor mixture comprising an organosilicon compound (which may or may not be a nitrogen-containing organosilicon compound) and $N_2$, $NO_2$, $N_2O$ and/or $NH_3$. In both cases, the precursor mixture preferably consists, or consists essentially, of these components.

A typical example of Moisture-barrier layer 2 is one in which each of precursor mixtures (A2), (C2) and, when present, (B2) comprises an organosilicon compound.

Moisture-Barrier Layer 3

Moisture-barrier layer 3 comprises sub-layers that are either:

[i] prepared by plasma deposition of a precursor mixture comprising (a) an organosilicon compound, (b) optionally $O_2$, $N_2O$, $NO_2$, $H_2$, $NH_3$ and/or $N_2$, and (c) optionally He, Ar and/or Kr; or

[ii] prepared by plasma deposition of a precursor mixture comprising (a) a compound of formula (X), (b) optionally $NH_3$, $N_2O$, $N_2$, $NO_2$, $CH_4$, $C_2H_6$, $C_3H_6$ and/or $C_3H_8$, and (c) optionally He, Ar and/or Kr.

Typically, the first sub-layer of Moisture-barrier layer 3 is of type [i], with subsequent sub-layers alternating between type [ii] and type [i]. Preferred coatings have the structures [i][ii], [i][ii][i], [i][ii][i][ii], [i][ii][i][ii][i], [i][ii][i][ii][i][ii], [i][ii][i][ii][i][ii][i] and so on. Each layer of sub-type [i] can be the same or different and each sub-layer of type [ii] can be the same or different.

Typically, the first sub-layer of Moisture-barrier layer 3 is prepared by plasma-deposition onto the substrate of a precursor mixture (A3) comprising (a) an organosilicon compound, (b) optionally $O_2$, $N_2O$, $NO_2$, $H_2$, $NH_3$ and/or $N_2$, and (c) optionally He, Ar and/or Kr. The precursor mixture (A3) typically consists, consists essentially, of these components.

It is preferable that the first sub-layer adheres well to the surface of the substrate. The exact precursor mixture that is required will depend upon the specific substrate, and a skilled person will be able to adjust the precursor mixture accordingly. However, Si-based layers which are organic in character adhere best to most substrates. A Si-based layer with organic character, and which will have particular good adhesion to the substrate and to the next sub-layer in the moisture-barrier layer, can be achieved by using a precursor mixture that contains no, or substantially no, oxygen-containing reactive gas (i.e. no, or substantially no, or $O_2$, $N_2O$ or $NO_2$), and preferably also contains $H_2$, $NH_3$, $N_2$, Ar, He and/or Kr. It is thus preferable that precursor mixture (A3) comprises an organosilicon compound and no, or substantially no, $O_2$, $N_2O$ or $NO_2$, and more preferably additionally contains $H_2$, $NH_3$, $N_2$, Ar, He and/or Kr. The resulting coating will be organic in character and so will adhere well to the surface of the substrate.

The final-sub layer of Moisture-barrier layer 3 is prepared from precursor mixture ($C_3$), whilst the optional intermediate sub-layers are prepared from precursor mixture(s) (B3). Precursor mixtures ($C_3$) and (B3) either comprise:

a hydrocarbon compound of formula (X), (b) optionally $NH_3$, $N_2O$, $N_2$, $NO_2$, $CH_4$, $C_2H_6$, $C_3H_6$ and/or $C_3H_8$, and (c) optionally He, Ar and/or Kr; or an organosilicon compound, (b) optionally $O_2$, $N_2O$, $NO_2$, $H_2$, $NH_3$ and/or $N_2$, and (c) optionally He, Ar and/or Kr At least one of the final sub-layer or, where present, the intermediate sub-layers of Moisture-barrier layer 3 is a hydrocarbon polymer of formula $C_mH_n$ prepared by plasma deposition of a precursor mixture comprising a hydrocarbon compound of formula (X), (b) optionally $NH_3$, $N_2O$, $N_2$, $NO_2$, $CH_4$, $C_2H_6$, $C_3H_6$ and/or $C_3H_8$, and (c) optionally He, Ar and/or Kr. The precursor mixture typically consists, consists essentially, of these components.

It is preferred that at least one sub-layer of Moisture-barrier layer 3 is substantially inorganic in character and contains very little carbon, due to improved moisture barrier-properties. Such layers can be prepared by, for example, plasma deposition of a precursor mixture that comprises an organosilicon compound and an oxygen-containing reactive gas (ie. $O_2$, $N_2O$ or $NO_2$). Addition of a non-reactive gases such as He, Ar or Kr, use of a high RF power density and/or reducing the plasma pressure will also assist in forming a layer with good moisture barrier properties. It is therefore preferred that at least one of the final sub-layer or, where present, the intermediate sub-layers of Moisture-barrier layer 3 is prepared by plasma deposition of a precursor mixture comprising an organosilicon compound and $O_2$, $N_2O$ and/or $NO_2$, and preferably also He, Ar and/or Kr. Preferably the precursor mixture consists, or consists essentially, of these components.

It is also preferred that that at least one sub-layer of Moisture-barrier layer 3 contains nitrogen atoms, due to improved moisture barrier-properties. Such a layer can be prepared by using a nitrogen-containing organosilicon compound, typically a silazane or aminosilane precursor, such as the compounds of formula (IV) to (VI) defined above. Nitrogen atoms can also be introduced by including $N_2$, $NO_2$, $N_2O$ or $NH_3$ as a reactive gas in the precursor mixture. It is therefore preferred that at least one of the final sub-layer or, where present, the intermediate sub-layers of Moisture-barrier layer 3 is prepared plasma deposition of a precursor mixture comprising a nitrogen-containing organosilicon compound, or a precursor mixture comprising an organosilicon compound (which may or may not be a nitrogen-containing organosilicon compound) and $N_2$, $NO_2$, $N_2O$ and/or $NH_3$. In both cases, the precursor mixture preferably consists, or consists essentially, of these components.

A typical example of Moisture-barrier layer 3 is one in which (i) precursor mixture (A3) comprises an organosilicon compound and (ii) precursor mixtures ($C_3$) and, when present, (B3) comprise either an organosilicon compound or a compound of formula (X), provided that at least one of precursor mixtures (B3) or ($C_3$) comprises a compound of formula (X).

(ii) The Gradient Layer

The gradient layer interposes the moisture-barrier layer and the mechanical-protective layer. The gradient layer is important as it prevents delamination of the moisture-barrier layer from the mechanical-protective layer, which might otherwise occur due to the differences in hardness between the two layers. In particular, the mechanical-protective layer typically has a hardness of at least 6 GPa, preferably at least 10 GPa, whereas the moisture-barrier layer typically has a hardness of 0.1 to 2 GPa, for example 0.2 to 0.9 GPa. Such a difference in hardness will often result in delamination, which the gradient layer prevents.

The composition of the gradient layer gradually changes from the plane which is in contact with the final sub-layer of the moisture-barrier layer (where its composition is identical, or essentially identical, to the final sub-layer of the moisture-barrier layer) to the plane which is in contact with the mechanical-protective layer (where its composition is identical, or essentially identical, to the moisture-barrier layer). Such a gradient layer can easily be prepared by switching gradually over time during the plasma deposition process from precursor mixture (C) to precursor mixture (E).

Typically, other plasma deposition process features such as RF power density and/or plasma pressure are also modified gradually over time during the plasma deposition process from those features used with precursor mixture (C) to those features that will be used with precursor mixture (E).

The thickness of the gradient layer is typically 40 nm to 1000 nm, and can be adjusted by altering the time period over which the switch from precursor mixture (C) to precursor mixture (E) occurs.

(iii) The Mechanical-Protective Layer

The mechanical-protective layer provides physical protection for the underlying substrate, and also for the moisture-barrier layer which is situated between the substrate and the mechanical-protective layer. It is important to protect the moisture-barrier layer, since it is generally relatively soft as discussed above.

The mechanical-protective layer is inorganic and is deposited onto the gradient-layer by plasma-deposition of a precursor mixture (E) comprising an organosilicon compound. The mechanical-protective layer is thus typically a silicon oxide-type material of formula $SiO_x$, or a silicon nitride-type material of formula $SiN_b$.

A mechanical-protective layer made of a material of formula $SiO_x$ can be prepared by plasma deposition of a precursor mixture that comprises an organosilicon compound and an oxygen-containing reactive gas (ie. $O_2$, $N_2O$ or $NO_2$). Accordingly, it is preferred that precursor mixture (E) comprises an organosilicon compound and an oxygen-containing reactive gas such as $O_2$, $N_2O$ or $NO_2$. It is particularly preferred that precursor mixture (E) comprises an organosilicon compound, an oxygen-containing reactive gas, such as $O_2$, $N_2O$ or $NO_2$, and a non-reactive gas such as He, Ar and/or Kr. Most preferably, precursor mixture (E) consists, or consists essentially, of the above components.

A mechanical-protective layer made of a material of formula $SiN_b$ can be prepared by plasma deposition of a nitrogen-containing organosilicon compound, typically a silazane or aminosilane precursor, such as the compounds of formula (IV) to (VI) defined above. Nitrogen atoms can also be introduced by including $N_2$ or $NH_3$ as a reactive gas in the precursor mixture. The nitrogen content of the $SiN_b$ material can be tuned by adding non-reactive gases (such as Ar and/or He) and/or mixing with reactive gases (such as $N_2$, $NH_3$ and/or $H_2$). In order to prepare a material of formula $SiN_b$ in which the content of H and O is minimal, it is generally preferably to use a high RF power density and/or a reduced plasma pressure.

The mechanical-protective layer typically has a nanohardness of at least 6 GPa, preferably at least 10 GPa. Nanohardness can be measured by nanohardness tester techniques well known to those skilled in the art. A specific method is described herein in the subsequent examples. See also W. C. Oliver and G. M. Pharr, J. Mater. Res. Vol. 7, Issue 6, pp. 1564-1583, 1992.

The inorganic mechanical-protective layers prepared as described above generally have more than adequate hardness, and the hardness can be further increased by addition of non-reactive gases such as He, Ar or Kr, use of a high RF power density and/or reducing the plasma pressure.

The thickness of the mechanical-protective is typically 40 nm to 1000 nm, preferably 70 nm to 500 nm, more preferably 70 to 300 nm, and can be adjusted by altering the time period over precursor mixture (E) is deposited.

The Substrate

The substrate upon which the protective coatings of the invention are deposited could be any suitable object that may require mechanical and moisture protection.

Typically, the substrate is the external casing of an electrical device, such as mobile telephones, headphones, wearables and the like. The protective coating is deposited on at least part of the external casing of the electrical device. It may be desirable in some cases to encapsulate the entire electrical device.

Alternatively, the substrate may be a printed circuit board. The protective coating is deposited on at least part of the printed circuit board, and preferably conformally coats the printed circuit board.

Alternatively, the protective coating may be used to protect paint on car body work. Thus, in those cases the substrate would be a painted car part that subsequently has the protective coating of the invention applied to it.

Definitions

As used herein, the term $C_1$-$C_6$ alkyl embraces a linear or branched hydrocarbon groups having 1 to 6, preferably 1 to 3 carbon atoms. Examples include methyl, ethyl, n-propyl and i-propyl, butyl, pentyl and hexyl. As used herein, the term $C_1$-$C_3$ alkyl embraces a linear or branched hydrocarbon group having 1 to 3, preferably 1 to 2 carbon atoms. Examples include methyl, ethyl, n-propyl and i-propyl.

As used herein, the term $C_2$-$C_6$ alkenyl embraces a linear or branched hydrocarbon groups having 2 or 6 carbon atoms, preferably 2 to 4 carbon atoms, and a carbon-carbon double bond. Preferred examples include vinyl and allyl. As used herein, the term $C_2$-$C_3$ alkenyl embraces a linear or branched hydrocarbon group having 2 or 3 carbon atoms and a carbon-carbon double bond. A preferred example is vinyl.

As used herein, the term $C_1$-$C_6$ alkoxy group is a said alkyl group which is attached to an oxygen atom. Preferred examples include methoxy, ethoxy, propoxy, isopropoxy, butoxy, isobutoxy, tert-butoxy, pentoxy and hexoxy.

As used herein, a halogen is typically chlorine, fluorine, bromine or iodine and is preferably chlorine, bromine or fluorine, most preferably fluorine.

As used herein, the term $C_1$-$C_6$ haloalkyl embraces a said $C_1$-$C_6$ alkyl substituted by one or more said halogen atoms. Typically, it is substituted by 1, 2 or 3 said halogen atoms. Particularly preferred haloalkyl groups are —$CF_3$ and —$CCl_3$.

As used herein, the reference to a precursor mixture containing "substantially no" specified component(s) refers to a precursor mixture that may contain trace amounts of the specified component(s), provided that the specified component(s) do not materially affect the essential characteristics of the resulting layer formed from the precursor mixture. Typically, therefore a precursor mixture that contains substantially no specified component(s) contains less than 5 wt % of the specified component(s), preferably less than 1 wt % of the specified component(s), most preferably less than 0.1 wt % a of the specified component(s).

DETAILED DESCRIPTION OF THE FIGURES

Aspects of the invention will now be described with reference to the embodiment shown in FIG. 1, in which like reference numerals refer to the same or similar components.

FIG. 1 shows a substrate 1 with a protective coating according to the invention which comprises (i) a moisture-barrier layer 2 which is in contact with the substrate 1 and which comprises a first sub-layer 3, optionally one or more intermediate sub-layers 4, and a final sub-layer 5, (ii) a mechanical-protective layer 7 which is inorganic, and (iii) a gradient layer 6 interposing the moisture-barrier layer 2 and the mechanical-protective layer 7.

EXAMPLES

Aspects of the invention will now be described with reference to the Examples below.

Example 1—Preparation of a Mechanical-Protective Layer

A gradient layer was deposited on Si-wafer by plasma deposition starting from HMDSO/Ar at pressures of 70 mtorr at 0.06 $Wcm^{-2}$. The pressure and power was then slowly increased to up to 120 mTorr and 0.9 $Wcm^{-2}$, respectively. Simultaneously, during the processing oxygen was introduced and slowly increased, whereas, Ar gas concentration was slowly reduced to zero. The thickness of the gradient layer was the deciding factor as far as the rate of change of these physical parameters are concerned.

Figure 2:
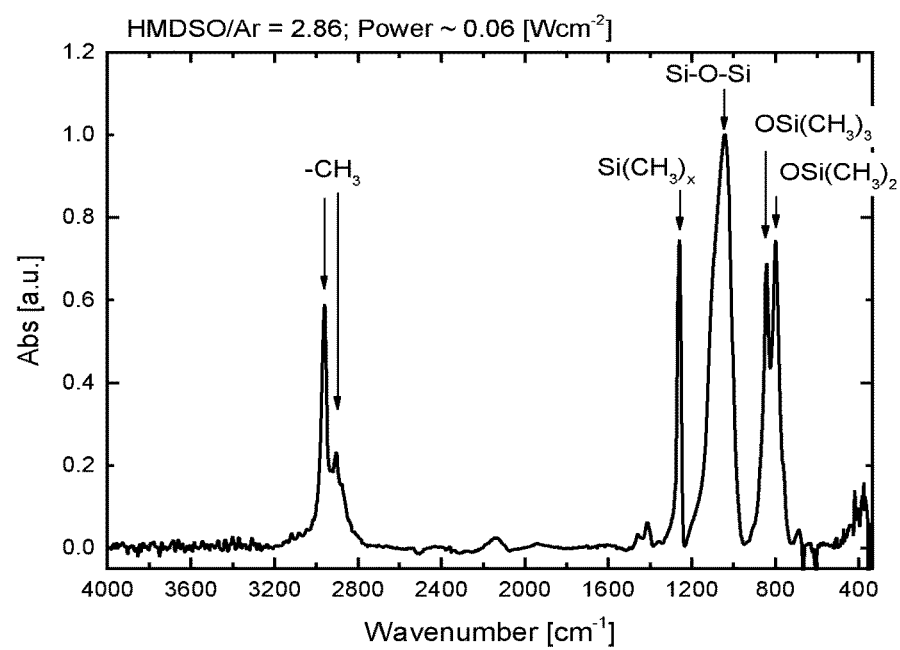
FIG. 2 shows the FTIR for the $SiO_xH_yC_z$ layer prepared initially in Example 1, and demonstrates its organic character.

The gradient layer was thus initiated from an organic layer of formula $SiO_xH_yC_z$, which was prepared by plasma deposition of HMDSO in the presence of Ar and with RF power of 0.06 $Wcm^{-2}$. The initial organic layer of formula $SiO_xH_yC_z$ had a nanohardness 0.8 GPa and refractive index of 1.486 (measured at 633 nm). The FTIR for this organic layer can be seen in FIG. 2.

Figure 3:
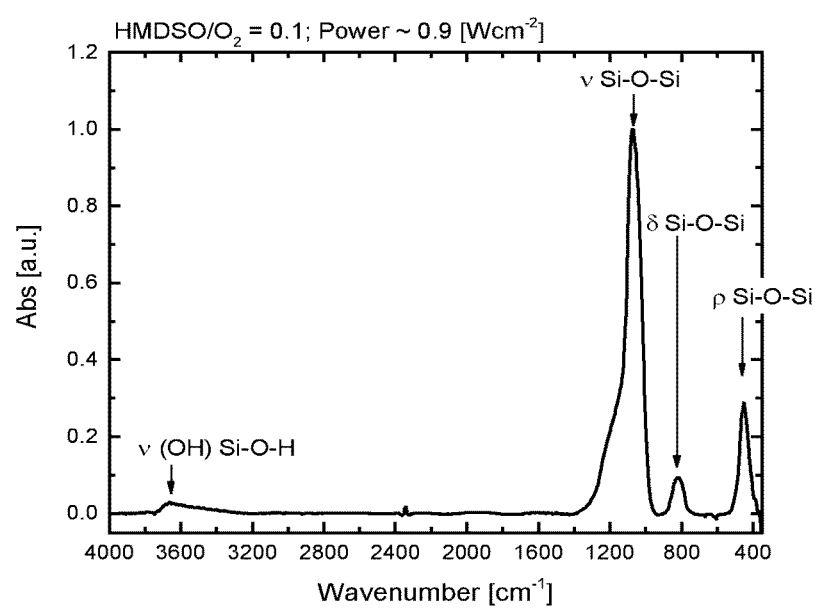
FIG. 3 shows the FTIR for the $SiO_x$ mechanical-protective layer prepared in Example 1, and demonstrates its inorganic character.

The gradient layer was terminated with an inorganic mechanical-protective layer of formula $SiO_x$, which was prepared by plasma deposition of HMDSO in the presence of $O_2$ and with RF power of 0.9 $Wcm^{-2}$. The mechanical-protective layer of formula $SiO_x$ had a nanohardness of 6.3 GPa and refractive index of 1.452 (measured at 633 nm). The FTIR for the $SiO_x$ layer can be seen in FIG. 3.

Figure 4:
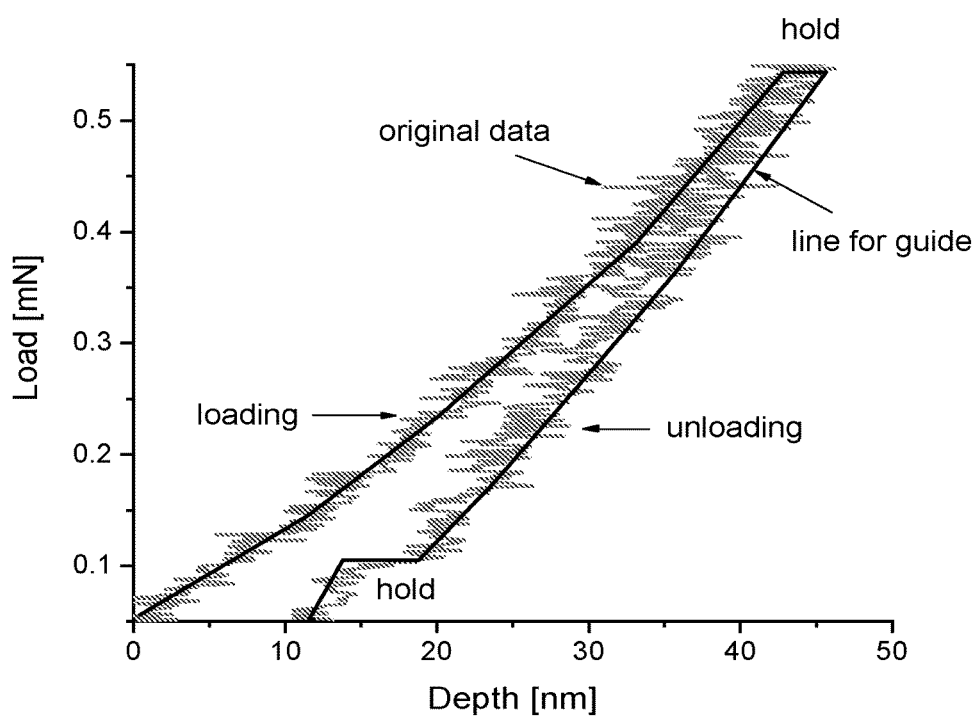
FIG. 4 shows the nanohardness loading/unloading curve for the $SiO_x$ mechanical-protective layer prepared in Example 1, and its nanohardness of 6.3 GPa.

The nanohardness measurements were performed using a nanoindenter tester where indentations were made using a Berkovich indenter. The results for the overall coating are shown in FIG. 4. The load-displacement curves/response were recorded under load controlled mode, where load and unload rates are controlled. The loads were chosen such that the maximum indentation depth was restricted only up to 10% of the thickness of the coating. Specifically, between 0.1 mN to 1.5 mN load. The loading and unloading curves were generated by 5 second hold after loading. Then unload at the same rate as for loading and on unloading hold at 80% of maximum for 60 seconds for thermal drift correction, then continue unloading to zero. The load-displacement response typically shows an elastic-plastic loading followed by an elastic unloading resulting into a hysteresis. Based on the method described in *W. C. Oliver and G. M. Pharr, J. Mater. Res. Vol. 7, Issue 6*, pp. 1564-1583, 1992, the unloading data were used to determine the hardness of the layers.

Example 2—Preparation of Moisture-Barrier Layer 1

Moisture-barrier layer 1, which comprises sub-layers that are either (i) prepared by plasma deposition of a precursor mixture comprising a fluorohydrocarbon, or (ii) prepared by plasma deposition of a precursor mixture comprising a compound of formula (X), was prepared as described below.

Example 2a—Deposition of Sub-Layer by Plasma Deposition of a Fluorohydrocarbon

A substrate was placed into a plasma deposition chamber and the atmosphere was evacuated to 50 mTorr. Hexafluoropropylene gas was then introduced to the chamber at a specific flow rate which was controlled at approximately 5 sccm using a mass flow controller. The RF generator was switched on at a power of 175 W and a plasma was formed. The hexafluoropropylene was ionized and then reacted with itself to form a sub-layer on the substrate. Once the desired coating thickness had formed, the RF generator was switched off and the flow of hexafluoropropylene was stopped.

The chamber was brought to atmospheric pressure and opened and the electrical assembly with a conformal coating was removed.

Example 2b—Deposition of a Single $C_mH_n$ Sub-Layer

A substrate was placed into a plasma deposition chamber and the atmosphere was evacuated to 50 mTorr. 1,4-dimethylbenzene vapour was then introduced to the chamber at a flow rate of approximately 10 sccm using a mass flow controller. The RF generator was switched on at a power of 175 W and a plasma was formed. The 1,4-dimethylbenzene was ionized and then reacted with itself to form a sub-layer on the substrate. Once the desired coating thickness had formed, the RF generator was switched off and the flow of 1,4-dimethylbenzene was stopped. Polymeric hydrocarbon $C_mH_n$ layers were obtained on the substrate.

Example 2c—Deposition of Moisture-Barrier Layer 1

Alternating sub-layer prepared in accordance with Example 2a and Example 2b are deposited on a substrate in order to builder up Moisture-barrier layer 1.

Example 3—Preparation of Moisture-Barrier Layer 2

Moisture-barrier layer 2, which comprises sub-layers that are each prepared by plasma deposition of a precursor mixture comprising an organosilicon compound, was prepared as described below.

Example 3a—Deposition of a Single $SiO_xC_yH_z$ Sub-Layer

A substrate was placed into a plasma-enhanced chemical vapour deposition (PECVD) deposition chamber, and the pressure was then brought to <$10^{-3}$ mbar. He was injected at a flow rate resulting in a chamber pressure of 0.480 mbar, then it was increased (by means of a throttle valve) to 0.50 mbar. Plasma was ignited at RF power of 45 W for 3-5 seconds. Next, HMDSO was injected into the chamber at a flow rate of 6 sccm and RF power density was at 0.225, 0.382, 0.573 or 0.637 Wcm$^{-2}$ for 20 minutes. Pressure was kept (through a throttle valve) at 0.5 mbar during the deposition process. Polymeric organosilicon $SiO_xC_yH_z$ layers were obtained on the substrate.

Example 3b—Deposition of Single $SiO_xH_z$ Sub-Layer

A substrate was placed into a PECVD deposition chamber, and the pressure was then brought to <$10^{-3}$ mbar. Against this base pressure, $O_2$ was inject up to 0.250 mbar of chamber pressure. After that, He was injected in order to reach a chamber pressure of 0.280 mbar. Finally, HMDSO was injected at a flow rate of 2.5 sccm and pressure was increased (by means of throttle valve) to 0.300 mbar. Plasma was then ignited with a power density of 0.892 Wcm$^{-2}$ and the process was continued until the desired thickness of approximate 750 nm was achieved. An inorganic $SiO_xH_z$ layer was obtained.

Example 3c—Deposition of $SiO_xC_yH_z/SiO_xH_z$ Moisture-Barrier Layer 2

The experimental conditions leading to the PECVD deposition of the $SiO_xC_yH_z/SiO_xH$, multilayers on substrates the same as described in Examples 3a and 3b. Briefly, $SiO_xC_yH_z$ was deposited with the same procedure explained in Example 3a (RF power density used for this experiment was 0.637 Wcm$^2$), then chamber was brought to vacuum (<$10^{-3}$ mbar) and the deposition of $SiO_xH_z$, on top of the $SiO_xC_yH_z$ layer, was performed according to the procedure explained in Example 3b. Then, a second $SiO_xC_yH_z$ layer was deposited on top of the $SiO_xH_z$ layer. The thickness of the second $SiO_xC_yH_z$ layer was half that of the first $SiO_xC_yH_z$ layer. This was achieved by halving the deposition time. These steps resulted in multilayer coating with the structure: $SiO_xC_yH_z/SiO_xH_z/SiO_xC_yH_z$.

The process was then repeated on some substrates in order to add a second pair of $SiO_xC_yH_z/SiO_xH_z$ layer, thereby giving the structure: $SiO_xC_yH_z/SiO_xH_z/SiO_xC_yH_z/SiO_xH_z/SiO_xC_yH_z$.

Example 4—Preparation of Moisture-Barrier Layer 3

Moisture-barrier layer 3, which comprises sub-layers that are either (i) prepared by plasma deposition of a precursor mixture comprising an organosilicon compound, or (ii) prepared by plasma deposition of a precursor mixture comprising a compound of formula (X), was prepared as described below.

Example 4a—Deposition of a Single $SiO_xC_yH_z$ Sub-Layer Using Ar as Non-Reactive Gas A substrate was placed into a plasma-enhanced chemical vapour deposition (PECVD) deposition chamber, and the pressure was then brought to ~$10^{-2}$ mbar. Hexamethyldisiloxane (HMDSO) and Ar were injected at a flow rate of 17.5 sccm and 20 sccm respectively. Pressure was allowed to stabilize and plasma was ignited at a RF power density of 0.057 Wcm$^{-2}$, resulting in a process pressure of 0.140 mbar. The process was run for 10 minutes.

Polymeric organosilicon SiO$_x$C$_y$H$_z$ layers were obtained on the substrate.

Example 4b—Deposition of Single SiO$_x$C$_y$H$_z$N$_h$ Sub-Layer Using N$_2$O as Reactive Gas A substrate was placed into a PECVD deposition chamber, and the pressure was then brought to ~$10^{-2}$ mbar. HMDSO and N$_2$O were injected at a flow rate of 17.5 sccm and 30 sccm respectively. Pressure was allowed to stabilize and plasma was ignited at a RF power density of 0.057 Wcm$^2$, resulting in a process pressure of 0.160 mbar. The process was run for 10 minutes.

Polymeric organosilicon SiO$_x$C$_y$H$_z$N$_b$ layers were obtained on the substrate.

Example 4c—Deposition of Single SiO$_x$C$_y$H$_z$N$_a$ Sub-Layer Using NH$_3$ as Reactive Gas and Ar as Non-Reactive Gas A substrate was placed into a PECVD deposition chamber, and the pressure was then brought to ~$10^{-2}$ mbar. HMDSO, NH$_3$ and Ar were injected at a flow rate of 4.4 sccm, 80 sccm and 20 sccm respectively. Pressure was allowed to stabilize and plasma was ignited at a RF power density of 0.057 Wcm$^{-2}$, resulting in a process pressure of 0.120 mbar. The process was run for 30 minutes. Polymeric organosilicon SiO$_x$C$_y$H$_z$N$_b$ layers were obtained on the substrate.

Example 4d—Deposition of Single C$_m$H$_n$ Hydrocarbon Sub Layer

A substrate was placed into a PECVD deposition chamber, and the pressure was then brought to ~$10^{-2}$ mbar. 1,4-dimethylbenzene (p-Xylene) was injected at a flow rate of 85 sccm. Pressure was allowed to stabilize and plasma was ignited at a RF power density of 0.057 Wcm$^2$, resulting in a process pressure of 0.048 mbar. The process was run for 20 minutes. Polymeric C$_m$H$_n$ layers were obtained on the substrate.

Example 4e—Deposition of SiO$_x$C$_y$H$_z$/SiO$_x$C$_y$H$_z$N$_b$/C$_m$H$_n$ Moisture-Barrier Layer 3

An organosilicon-hydrocarbon moisture barrier was deposited with the following types of sub-layer:
1) First sub-layer and final sub-layer: 150 nm (±10%) of SiO$_x$C$_y$H$_z$ prepared according to Example 4a.
2) Intermediate sub-layer 1: 250 nm (10%) of C$_m$H$_n$ prepared according to Example 4d
3) Intermediate sub-layer 2: 150 nm (±10%) of SiO$_x$C$_y$H$_z$N$_b$ prepared according to Example 4b The multilayer conformal coating had the following structure made up of the above layers:

First sub-layer/(Intermediate sub-layer 1/Intermediate sub-layer 2)×3/Intermediate sub-layer 1/Final sub-layer Deposition of the moisture-barrier layer was performed in a PECVD chamber, conditions described below. A substrate was placed into a PECVD deposition chamber, and the pressure was then brought to ~$10^{-2}$ mbar.

HMDSO and Ar were injected at a flow rate of 17.5 sccm and 20 sccm respectively. Pressure was allowed to stabilize and plasma was ignited at a RF power density of 0.057 Wcm$^{-2}$ resulting in a process pressure of 0.140 mbar. The process was run for the time needed to deposit 150 nm (10%). After this step, the PECVD chamber was brought to vacuum (no gas; vapour injected) and, after having reached ~$10^{-2}$ mbar, p-Xylene was injected at a flow rate of 85 sccm. Pressure was allowed to stabilize and plasma was ignited at RF at a power density of 0.057 Wcm$^{-2}$, resulting in a process pressure of 0.048 mbar. The process was run for the time needed to reach 250 nm (±10%). After this step, the PECVD chamber was brought to vacuum (no gas; vapour injected) and, after having reached ~$10^2$ mbar, and HMDSO and N$_2$O were injected at a flow rate of 17.5 sccm and 30 sccm respectively and pressure was allowed to stabilize. Plasma was ignited at a RF power density of 0.057 Wcm$^{-2}$, resulting in a process pressure of 0.160 mbar.

The latter two steps were repeated two times more and then as final step a top layer of SiO$_x$C$_y$H$_z$ was deposited, after evacuating the PECVD chamber to $10^{-2}$ mbar as in Example 4a.

What is claimed:
1. A method of depositing a protective coating onto a substrate, wherein the depositing the protective coating comprises:
depositing a first sub-layer prepared from a first precursor mixture of an organosilicon compound and no, or substantially no, O$_2$, N$_2$O or NO$_2$, and comprises one of H$_2$, NH$_3$, N$_2$, Ar, He and/or Kr; and
depositing one or more subsequent alternating layers of:
a first intermediate sub-layer which is a hydrocarbon polymer of formula C$_m$H$_n$ prepared by plasma-deposition of a second precursor mixture comprising a hydrocarbon compound of formula (X), and optionally NH$_3$, N$_2$O, N$_2$, NO$_2$, CH$_4$, C$_2$H$_6$, C$_3$H$_6$ and C$_3$H$_8$, He, Ar and/or Kr;
the hydrocarbon compound of formula (X);

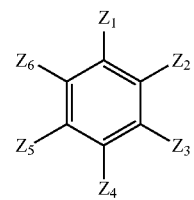

(X)

wherein:
Z$_1$ represents C$_1$-C$_3$ alkyl or C$_2$-C$_3$ alkenyl;
Z$_2$ represents hydrogen, C$_1$-C$_3$ alkyl or C$_2$-C$_3$ alkenyl;
Z$_3$ represents hydrogen, C$_1$-C$_3$ alkyl or C$_2$-C$_3$ alkenyl;
Z$_4$ represents hydrogen, C$_1$-C$_3$ alkyl or C$_2$-C$_3$ alkenyl;
Z$_5$ represents hydrogen, C$_1$-C$_3$ alkyl or C$_2$-C$_3$ alkenyl; and
Z$_6$ represents hydrogen, C$_1$-C$_3$ alkyl or C$_2$-C$_3$ alkenyl; and
a second intermediate sub-layer which is prepared by using a third precursor mixture of nitrogen-containing organosilicon compounds or an organosilicon with a nitrogen-containing co-precursor.
2. The method according to claim 1, wherein four to thirteen sub-layers are used.

3. The method according to claim 1, wherein the second precursor mixture contains two or more compounds of formula (X).

4. The method according to claim 1, wherein the third precursor mixture comprises compounds independently selected from the group consisting of hexamethyldisiloxane (HMDSO), tetramethyldisiloxane (TMDSO), 1,3-divinyltetramethyldisiloxane (DVTMDSO), hexavinyldisiloxane (HVDSO) allyltrimethylsilane, allyltrimethoxysilane (ATMOS), tetraethylorthosilicate (TEOS), trimethylsilane (TMS), triisopropylsilane (TiPS), trivinyl-trimethyl-cyclotrisiloxane (V3D3), tetravinyl-tetramethyl-cyclotetrasiloxane (V4D4), tetramethylcyclotetrasiloxane (TMCS), octamethylcyclotetrasiloxane (OMCTS), hexamethyldisilazane (HMDSN), 2,4,6-trimethyl-2,4,6-trivinylcyclotrisilazane, dimethylamino-trimethylsilane (DMATMS), bis(dimethylamino)dimethylsilane (BDMADMS) and tris(dimethylamino)methylsilane (TDMAMS).

5. The method according to claim 1, wherein the protective coating has a nano-hardness of at least 6 GPa.

6. The method according to claim 1, wherein the substrate is (i) the external casing of an electrical device, or (ii) a printed circuit board.

\* \* \* \* \*